(12) United States Patent
Nguyen (10) Patent No.: US 7,233,184 B1
(45) Date of Patent: Jun. 19, 2007

(54) METHOD AND APPARATUS FOR A CONFIGURABLE LATCH

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 174 days.

(21) Appl. No.: 11/158,523

(22) Filed: Jun. 22, 2005

(51) Int. Cl.
*H03K 3/12* (2006.01)

(52) U.S. Cl. .................. 327/199; 327/201; 327/202

(58) Field of Classification Search .............. None
See application file for complete search history.

(56) References Cited

U.S. PATENT DOCUMENTS

| | | | | |
|---|---|---|---|---|
| 5,689,517 A * | 11/1997 | Ruparel | ........................ | 714/731 |
| 6,006,348 A * | 12/1999 | Sode et al. | .................. | 714/731 |
| 6,181,179 B1 * | 1/2001 | Kanba | ......................... | 327/202 |
| 6,188,260 B1 * | 2/2001 | Stotz et al. | .................. | 327/202 |
| 6,389,566 B1 * | 5/2002 | Wagner et al. | ............... | 714/726 |
| 6,456,113 B2 * | 9/2002 | Kanba | .......................... | 326/93 |
| 6,720,813 B1 * | 4/2004 | Yee et al. | .................... | 327/218 |
| 6,873,197 B2 * | 3/2005 | Kanba | ......................... | 327/202 |

* cited by examiner

*Primary Examiner*—Kenneth B. Wells
*Assistant Examiner*—An T. Luu
(74) *Attorney, Agent, or Firm*—LeRoy D. Maunu; Lois D. Cartier (57) ABSTRACT

A configurable latch comprises a dual master stages arranged in parallel to share a single output node. The configurable latch provides a single slave stage at the single output node to be shared between the two master stages. Pass gates controlled by various phases of an input clock, controls access to the slave stage by the two master stages. Additional control is added to configure the latch for positive edge triggered and negative edge triggered flip-flop functionality as well as level sensitive functionality. Chip enable, set, and reset are also provided for additional control.

20 Claims, 8 Drawing Sheets

METHOD AND APPARATUS FOR A CONFIGURABLE LATCH

FIELD OF THE INVENTION

The present invention generally relates to latches, and more particularly to an area efficient latch topology that utilizes component sharing to reduce redundancy.

BACKGROUND

Modern digital circuits, whether implemented in integrated circuits (IC) or in discrete form, often utilize data latches. Two of the most common types of data latches in use today are the level-sensitive (LS) latch and the edge-triggered (ET) latch.

The logic output of an LS latch generally depends upon the activity of the clock signal that is present at its clock input pin. In particular, the output logic state of the LS latch reflects the logic state present at its input pin during a portion of the input clock cycle. In this phase of operation, the latch becomes transparent and passes logic values present at its input directly to its output. In a second phase of operation, the LS latch maintains its output at a fixed logic level during the remaining portion of the input clock cycle, regardless of the logic level present at its input.

One implementation of an ET latch includes a combination of two LS latches. The first LS latch, i.e., the master stage, is transparent during a first phase of the input clock, while the second LS latch, i.e., the slave stage, is transparent during a second phase of the input clock. The combined behavior is such that the input data is captured and passed to the output only when the clock signal exhibits a low-to-high logic transition. Conversely, the configuration of the two LS latches may be altered to capture input data during a high-to-low logic transition.

Often, the master-slave stages are used in parallel configuration to implement a double data rate (DDR) latch topology. In particular, a serial data stream may be broken out into two serial data streams, whereby a first DDR latch accepts, for example, the even bits of the serial data stream, while a second DDR latch accepts the odd bits of the serial data stream. After the two DDR latches have latched their respective data bits, the data bits may be retrieved from each latch and then re-combined into a single data stream through the use of, for example, a 2:1 multiplexer. Thus, in order to implement the DDR latch, a dual latch configuration is often used, which combines two master stages, two slaves stages, and a single 2:1 multiplexer.

In IC implementations, however, latches are often used in large numbers. Accordingly, a significant amount of semiconductor die area is required due to the redundancy of the design implementation. Similarly, the amount of power consumed by these implementations generally increases in linear proportion to the number of latches implemented.

SUMMARY

To overcome limitations in the prior art, and to overcome other limitations that will become apparent upon reading and understanding the present specification, some embodiments of the present invention disclose an apparatus and method for a configurable latch that results in a reduction of the number of components required to implement the latch, while maintaining features that are characteristic with latches.

In accordance with one embodiment of the invention, a latch comprises a first master stage that is coupled to receive a first data signal and a clock signal and is adapted to latch the first data signal at a first node in response to a first phase of the clock signal. The latch further comprises a second master stage that is coupled to receive a second data signal and the clock signal and is adapted to latch the second data signal at a second node in response to a second phase of the clock signal. The latch further comprises a slave stage that is adaptively coupled to the first and second nodes. The slave stage is coupled to the first node during the first phase of the clock signal and is coupled to the second node in response to the second phase of the clock signal.

In accordance with another embodiment of the invention, a configurable latch comprises a first stage that is adaptively coupled to receive a first data signal and is adaptively coupled to provide the first data signal to a common node. The configurable latch further comprises a second stage that is adaptively coupled to receive a second data signal and is adaptively coupled to provide the second data signal to the common node. The configurable latch further comprises a third stage that is coupled to the common node and is adapted to provide the first and second data signals as an output signal of the configurable latch. The first and second stages alternating access to the common node.

In accordance with another embodiment of the invention, a configurable latch comprises a means for adaptively latching a first data signal at a first node during a first phase of a clock signal, a means for adaptively latching a second data signal at a second node during a second phase of the clock signal, and a means for passing the first and second data signals received from the first and second nodes through a single latch to provide an output of the configurable latch.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the present invention provide a configurable latch that may be implemented using a fewer number of components. The configurable latch may be programmed for operation as a double data rate (DDR) latch, a positive edge triggered D flip-flop, a negative edge triggered D flip-flop, a level sensitive latch, or bypassed. Features that may be associated with latches, such as chip enable, set, and reset are also provided.

Through several embodiments of the present invention, configurable latch functionality is provided through a parallel implementation of dual master stages, each of which share a single slave stage. The single slave stage interoperates with the master stages to be fully operative in all modes of operation.

Figure 1:
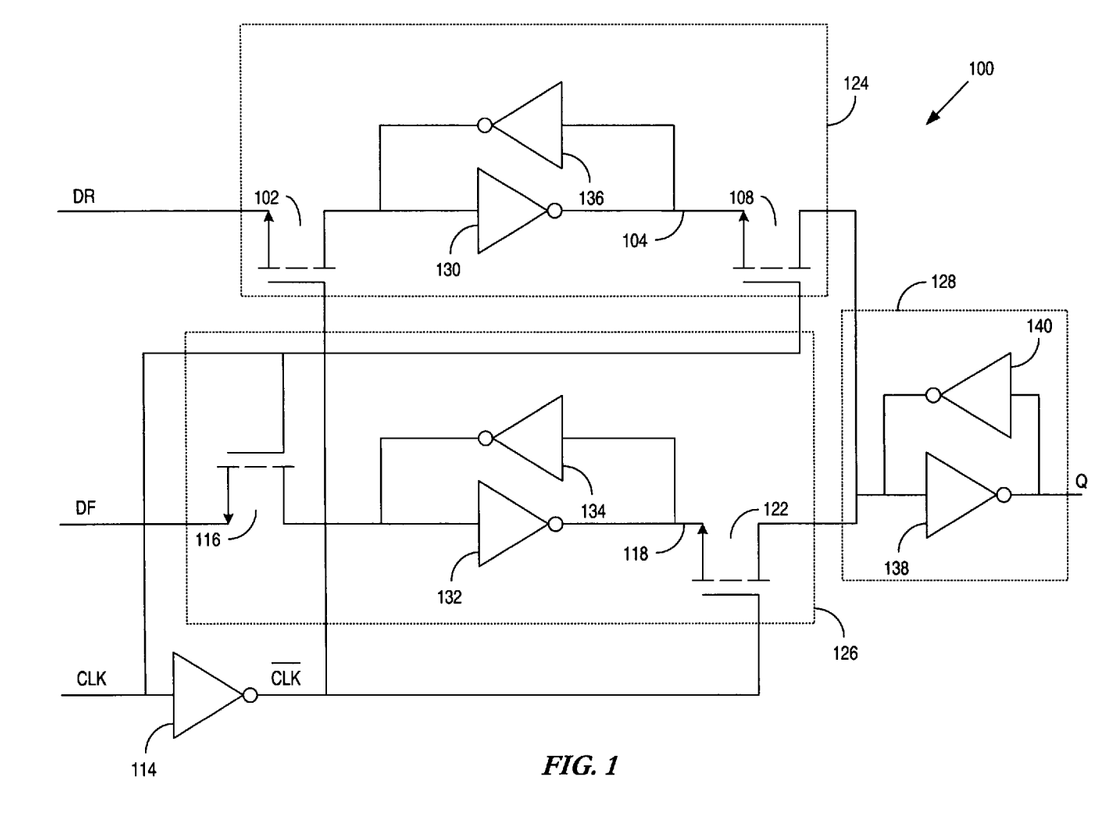
FIG. 1 illustrates a schematic diagram of a double data rate (DDR) latch in accordance with the present invention.

Turning to FIG. 1, double data rate (DDR) latch 100 in accordance with an embodiment of the present invention is exemplified. It can be seen by inspection, that master stages 124 and 126 share slave stage 128, such that the rising edge data, DR, accepted by master stage 124 and the falling edge data, DF, accepted by master stage 126 are each accepted by slave stage 128 to ultimately produce the data output, Q. Pass gates 102 and 116 determine when the data values, DR and DF, become transparent to nodes 104 and 118, respectively. Similarly, pass gates 108 and 122 determine when the data values at nodes 104 and 118 become transparent to output node Q, respectively.

The control terminals of n-type field effect transistors (NFETs) 108 and 116 are connected to signal CLK, while the control terminals of NFETs 102 and 122 are connected to signal $\overline{CLK}$. Thus, NFETs 116 and 108 are conductive when signal $\overline{CLK}$ is at a logic high level, while NFETs 102 and 122 are conductive when signal $\overline{CLK}$ is at a logic high level.

Master stages 124 and 126 are comprised of two inverters in feedback configuration, whereby the outputs of forward inverters 130 and 132 are connected to the inputs of feedback inverters 136 and 134, respectively. Similarly, the outputs of feedback inverters 136 and 134 are connected to the inputs of forward inverters 130 and 132, respectively.

Slave stage 128 similarly provides forward inverter 138 to accept its input from the commonly connected conductors of NFETs 108 and 122. The output of forward inverter 138 is connected to output terminal Q as well as to the input of inverter 140. The output of inverter 140 is then connected to the commonly connected conductors of NFETs 108 and 122 as well as the input to inverter 138.

In operation, data signals, DR and DF, are applied to the respective conductors of NFETs 102 and 116. Data signal, DF, is passed into master stage 126 by pass gate 116 once pass gate 116 becomes conductive. Thus, during the time that signal CLK is at a logic high value, master stage 126 is transparent, thereby allowing an inverted version of signal DF to appear at node 118.

Once signal CLK transitions to a logic low value, pass gate 116 becomes non-conductive, thus blocking the ability of signal DF to influence the logic state of node 118. At the same time, signal $\overline{CLK}$ transitions to a logic high value, which causes pass gate 122 to become conductive. As such, the logic state at node 118 is transferred to node Q via slave stage 128. Since slave stage 128 imposes another inversion upon signal DF, the logic level at node Q matches the logic level of signal DF at the time it was latched by master/slave stage 126/128.

The operation on signal DR as it relates to master/slave stage 124/128 is similar. During the time that signal $\overline{CLK}$ is at a logic high value, master stage 124 is transparent, thereby allowing an inverted version of signal DR to appear at node 104. Once signal $\overline{CLK}$ transitions to a logic low value, pass gate 102 becomes non-conductive, thus blocking the ability of signal DR to influence the logic state of node 104. At the same time, signal CLK transitions to a logic high value, which causes pass gate 108 to become conductive. As such, the logic state at node 104 is transferred to node Q via slave stage 128. Since slave stage 128 imposes another inversion upon signal DR, the logic level at node Q matches the logic level of signal DR at the time it was latched by master/slave stage 124/128.

Figure 2:
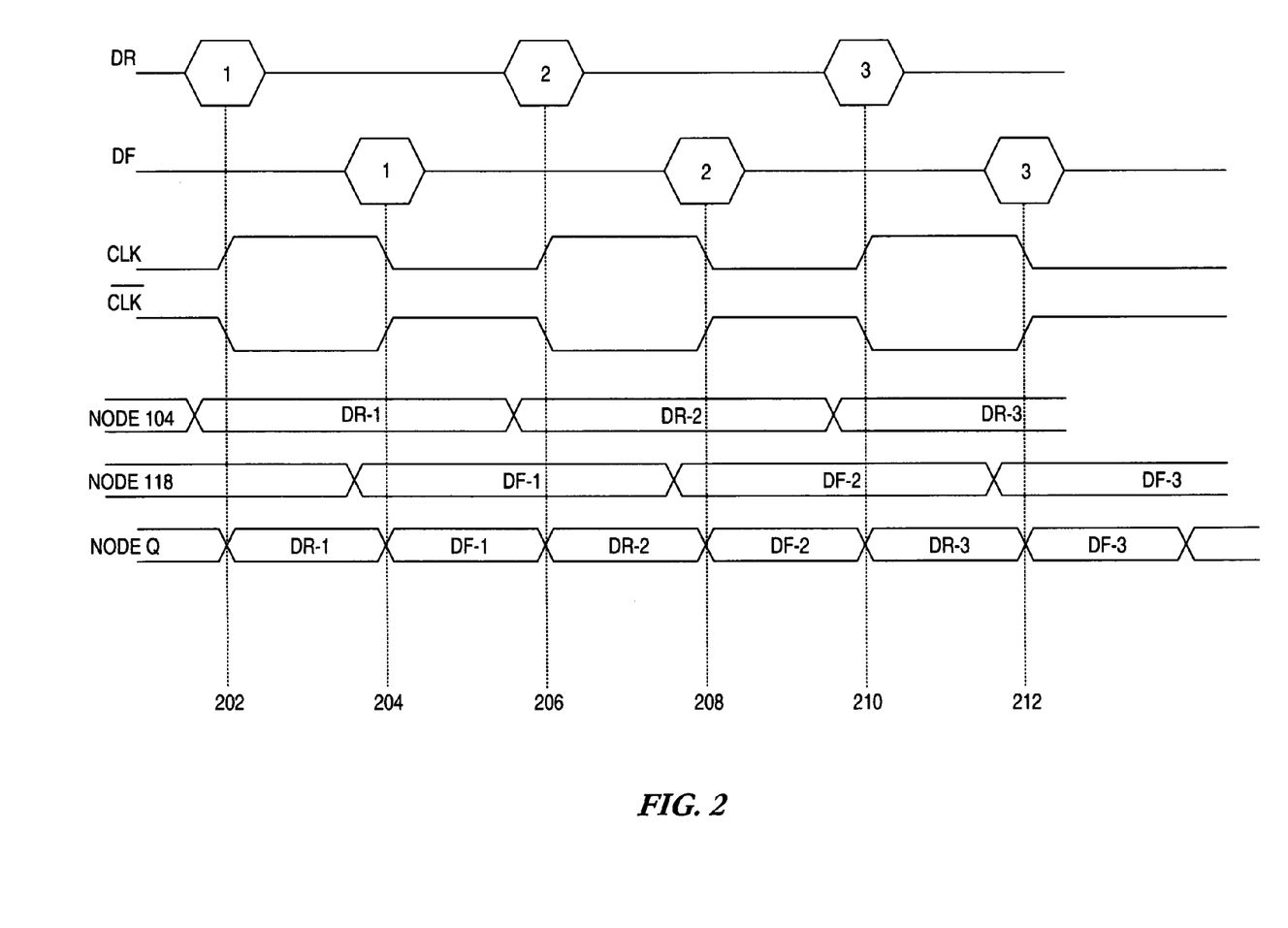
FIG. 2 illustrates an exemplary timing diagram of the DDR latch of FIG. 1.

The operation of DDR latch 100 may be further explained in conjunction with the timing diagram of FIG. 2. Just prior to time 202, data bit, DR-1, is stable and transparent to node 104. That is to say, that signal $\overline{CLK}$ maintains pass gate 102 in its conductive state just prior to time 202, thus providing an inverted version of signal DR-1 at node 104. At time 202, signal DR-1 becomes latched by master stage 124, since pass transistor 102 becomes non-conductive and pass transistor 108 becomes conductive. Thus, the signal at node 104 becomes transparent to output node, Q, ignoring any propagation delays that may be present.

Just prior to time 204, data bit, DF-1, is stable and transparent to node 118. That is to say, that signal CLK maintains pass gate 116 in its conductive state just prior to time 204, thus providing an inverted version of signal DF-1 to node 118. At time 204, signal DF-1 becomes latched by master stage 126, since pass transistor 116 becomes non-conductive and pass transistor 122 becomes conductive. Thus, the signal at node 118 becomes transparent to output node, Q, ignoring any propagation delays that may be present.

Similar operation may be verified for data signals DR-2, DF-2, DR-3, and DF-3 at times 206-212, respectively. As can be seen, therefore, DDR latch 100 of FIG. 1 is effective to provide DDR functionality, such that serial data bit streams, DR and DF, are each latched and propagated to output node Q, without the need for redundant slave stages. Accordingly, slave stage 128 may be shared by master stages 124 and 126 without worry of unwanted data pass-through and master stage override, since the feedback inverters of master stages 124 and 126, i.e., 136 and 134, respectively, are much slower than clock inverter 114. As such, the correct conductivity states of pass gates 102, 108, 116, and 122 are set in adequate time to allow sufficient master-to-slave stage propagation, while also ensuring that new data arriving at the input to master stages 124 and/or 126 is not given the opportunity to change the state of slave stage 128.

Figure 3:
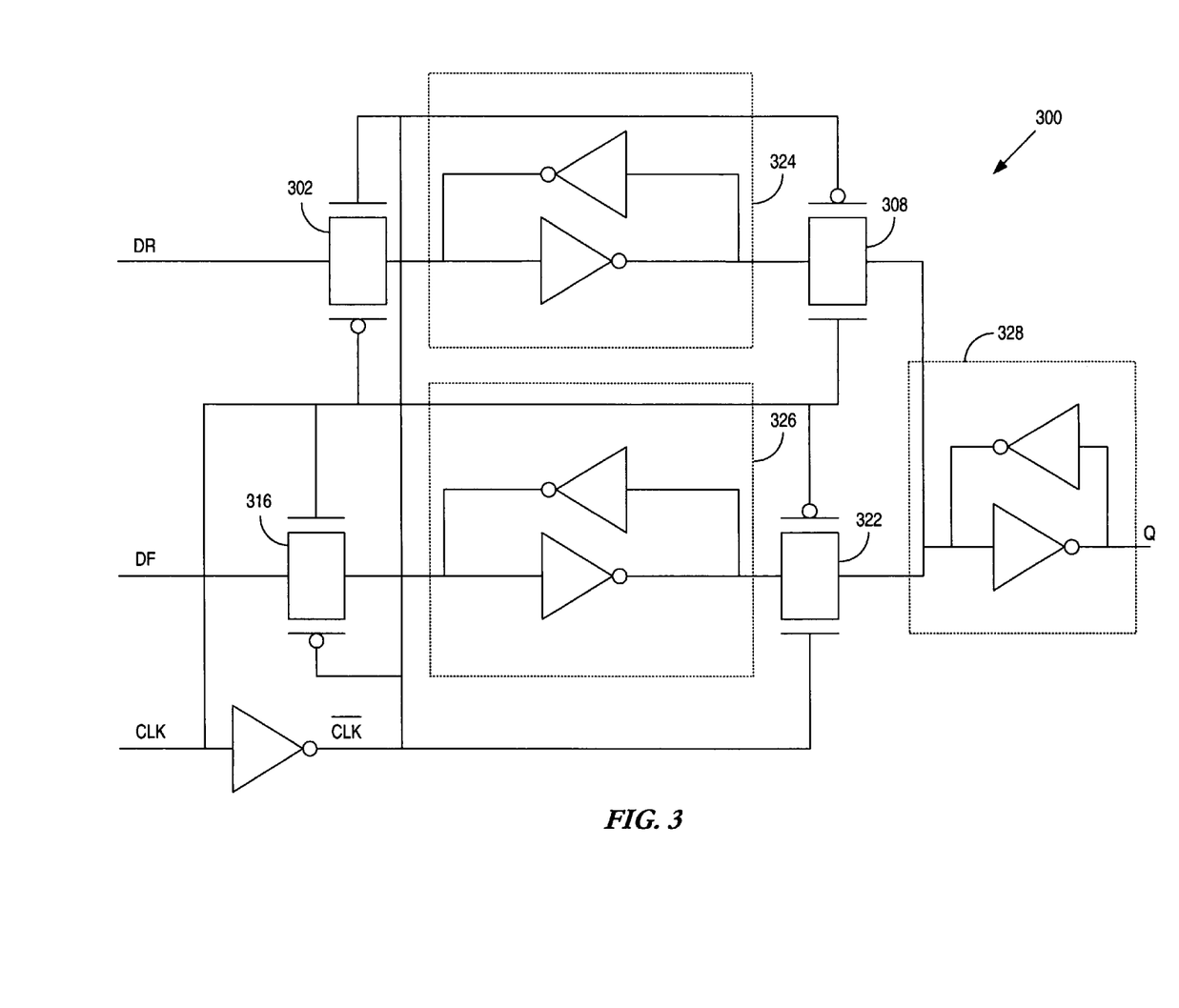
FIG. 3 illustrates an alternative embodiment of a DDR latch in accordance with the present invention.

In an alternative embodiment in accordance with the present invention, pass gates 102, 108, 116, and 122 may be replaced with Complementary Metal Oxide Semiconductor (CMOS) transmission gates 302, 308, 316, and 322 as exemplified by DDR latch 300 of FIG. 3. An improvement in signal integrity may be realized with the CMOS pass gates, since the voltage drop suffered across n-type Field Effect Transistors (NFETs) 102, 108, 116, and 122 is virtually eliminated through the use of CMOS transmission gates. Accordingly, flipping stages 324, 326, and 328 becomes an easier task. The timing diagram associated with the operation of DDR latch 300 is similar to the timing diagram of FIG. 2.

Figure 4:
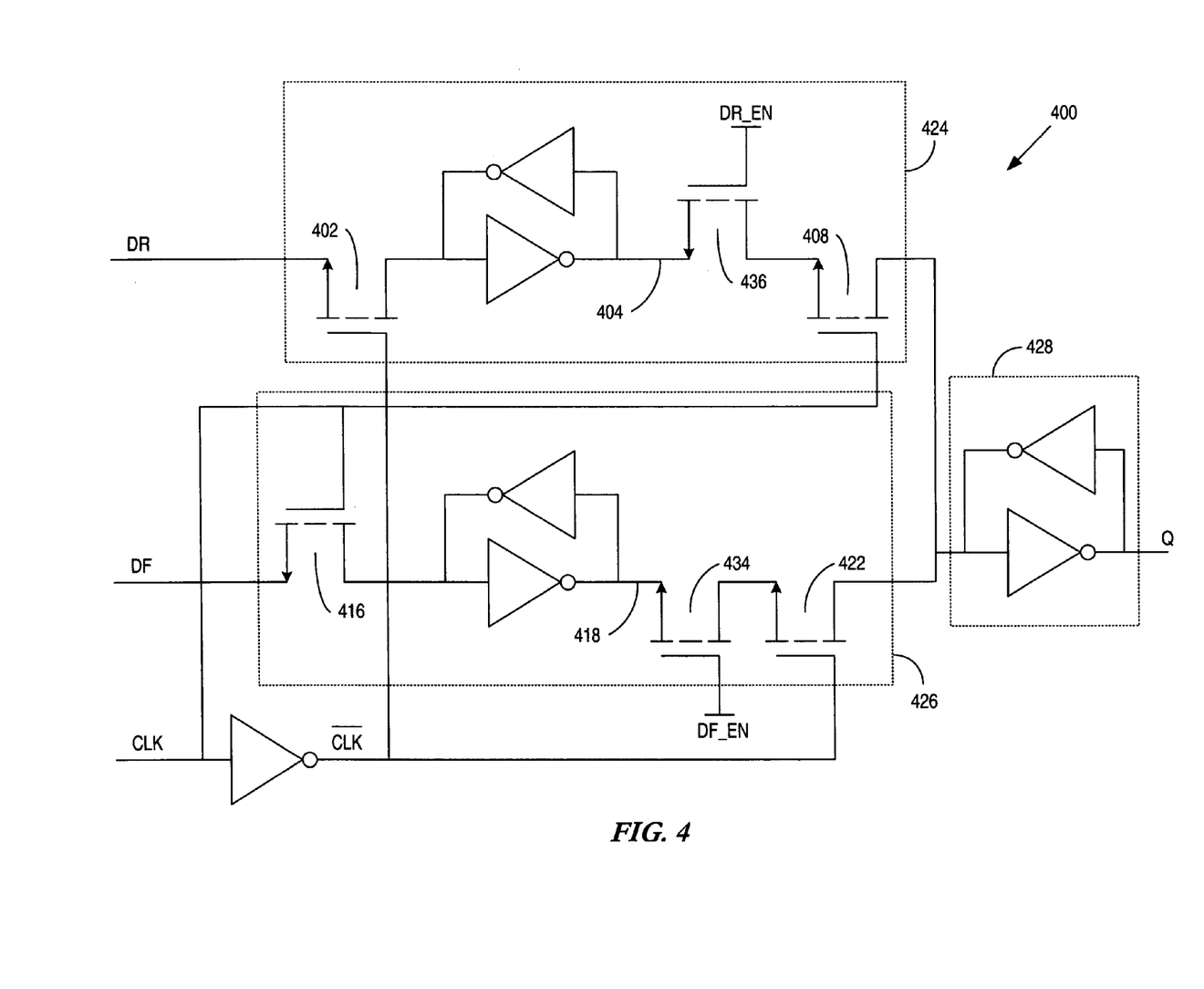
FIG. 4 illustrates an alternative embodiment of a DDR latch in accordance with the present invention.

In an alternative embodiment in accordance with the present invention, DDR latch 400 of FIG. 4 may be programmable to operate as either a DDR latch, a positive edge triggered D flip-flop, a negative edge triggered D flip-flop, or may be disabled to hold its previously latched Q output value.

When programmed for DDR operation, signals DR_EN and DF_EN are both at a logic high value, such that transistors 436 and 434, respectively, are conductive. As such, master stages and 426 and 424 are activated for operation in a similar manner as discussed above in relation to FIG. 1. Conversely, if the logic values of signals DR_EN and DF_EN are both at a logic low value, both transistors 434 and 436 become non-conductive to disable DDR latch 400. Output Q then maintains the logic value latched by slave stage 428 at node Q prior to the disabling of DDR latch 400.

DDR latch 400 may also be programmed to function as a positive edge triggered D flip-flop, by asserting signal DR_EN to a logic high level, while deasserting signal DF_EN to a logic low level. In such an instance, master stage 424 combines with slave stage 428 to implement positive edge triggered D flip flop functionality.

In particular, once signal $\overline{CLK}$ transitions to a logic low value, pass gate 402 becomes non-conductive, thus blocking the ability of signal DR to influence the logic state of node 404. At the same time, signal CLK transitions to a logic high value, which causes pass gate 408 to become conductive. As such, the logic state at node 404 is transferred to node Q via slave stage 428. Since slave stage 428 imposes another inversion upon signal DR, the logic level at node Q matches the logic level of signal DR at the time it was latched by master/slave stage 424/428. Since signal DF_EN is at a logic low value, the DF data path is deactivated, whereby the only data transitions at node Q are as a result of the rising edge of signal CLK in master stage 424.

DDR latch 400 may also be programmed to function as a negative edge triggered D flip-flop, by asserting signal DF_EN to a logic high level, while deasserting signal DR_EN to a logic low level. In such an instance, master stage 426 combines with slave stage 428 to implement negative edge triggered D flip flop functionality.

In particular, once signal CLK transitions to a logic low value, pass gate 416 becomes non-conductive, thus blocking the ability of signal DF to influence the logic state of node 418. At the same time, signal $\overline{CLK}$ transitions to a logic high value, which causes pass gate 422 to become conductive. As such, the logic state at node 418 is transferred to node Q via slave stage 428. Since slave stage 428 imposes another inversion upon signal DF, the logic level at node Q matches the logic level of signal DF at the time it was latched by master/slave stage 426/428. Since signal DR_EN is at a logic low value, the DR data path is deactivated, whereby the only data transitions at node Q are as a result of the falling edge of signal CLK in master stage 426.

Figure 5:
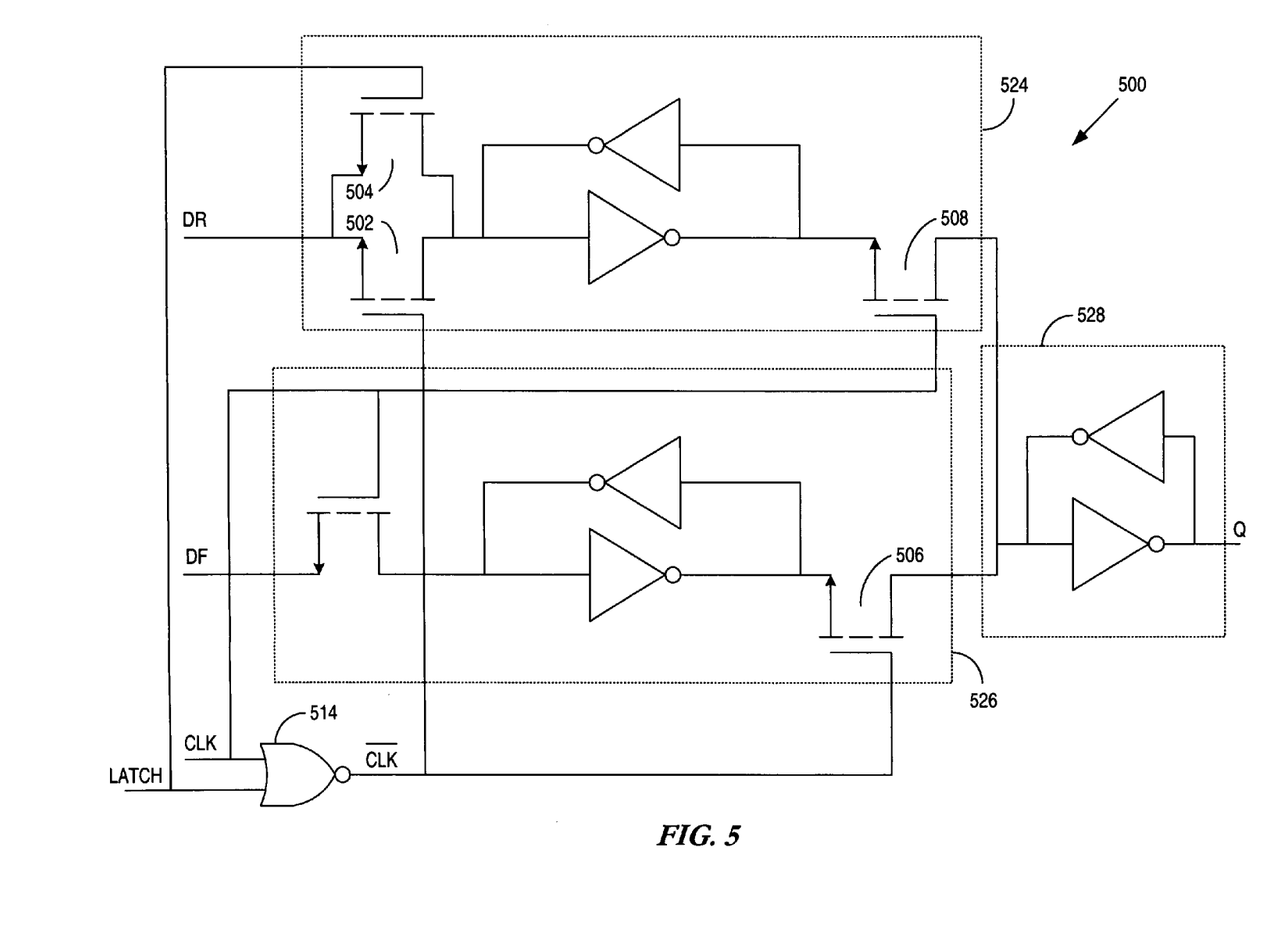
FIG. 5 illustrates an alternative embodiment of a DDR latch in accordance with the present invention.

In an alternative embodiment, DDR latch 500 of FIG. 5 is exemplified with latch enable capability. In particular, transistor 504 is added in parallel to transistor 502 of the DR data path. The conductivity of transistor 504 is controlled via signal LATCH, where signal LATCH is also gated through NOR gate 514. When signal LATCH is at a logic low, NOR gate 514 operates as an inverter and DDR latch 500 functions as discussed above in relation to FIG. 1, since transistor 504 is in a non-conductive state.

When signal LATCH is at a logic high level, on the other hand, the output of NOR gate 514 transitions to a logic low value, irregardless of the logic level of signal CLK. Thus, transistor 506 is in a non-conductive state, thus disabling master stage 526. Transistor 502 is similarly placed into a non-conductive state, while transistor 504 is placed into a conductive state due to the logic high level of signal LATCH. As such, transistor 504 passes all values of signal DR through master stage 524, which are then passed by transistor 508, through slave stage 528, and onto node Q when signal CLK is at a logic high level. Thus, operation of DDR latch 500 becomes a level sensitive (LS) latch in response to assertion of signal LATCH.

Figure 6:
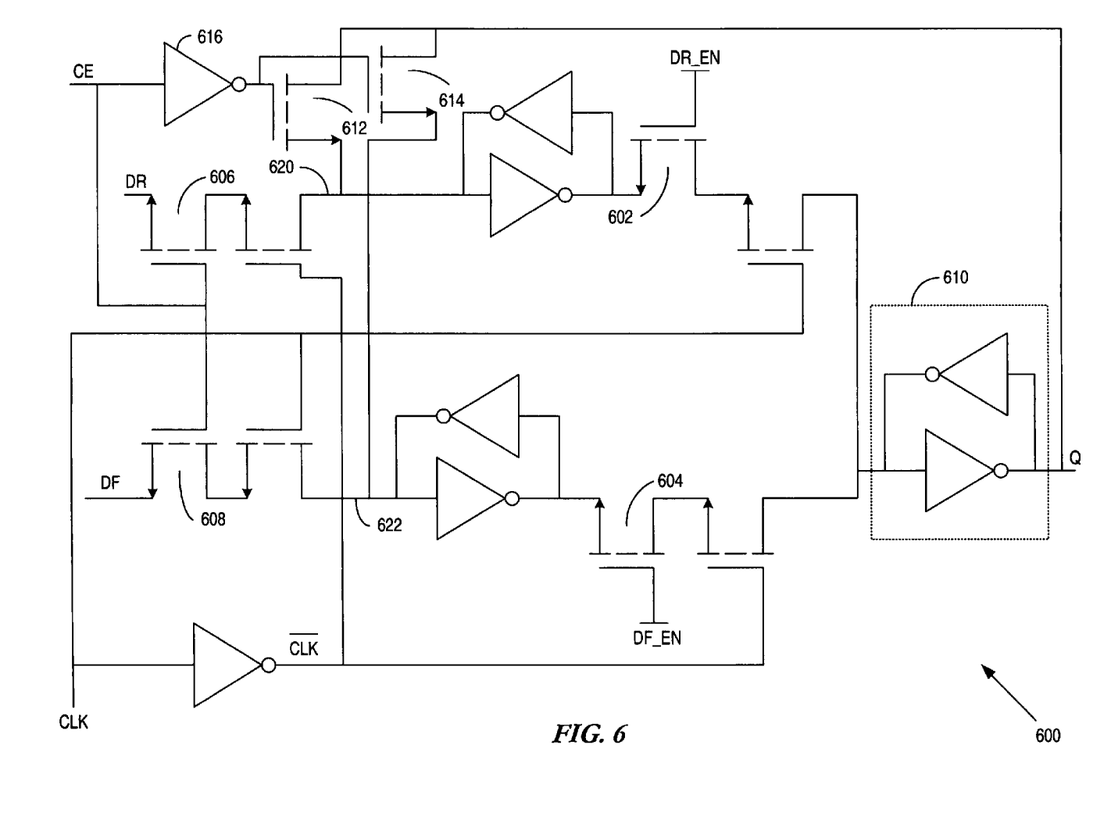
FIG. 6 illustrates an alternative embodiment of a DDR latch in accordance with the present invention.

Turning to FIG. 6, an alternative embodiment of DDR latch 600 is exemplified, which utilizes signal CE in combination with transistors 606 and 608 to disable data paths for data signals DR and DF. In particular, when signal CE is at a logic low value, transistors 606 and 608 are placed into a non-conductive state, such that regardless of the data values of DR and DF, output Q of slave stage 610 will not change.

Once data paths DR and DF are disabled, precautions should be taken to initialize the logic state at nodes 620 and 622 to be consistent with the logic state present at node Q at the time that data paths DR and DF were disabled. This is so because operation of signal CE is asynchronous with signal CLK and as such, re-enabling of data paths DR and DF through operation of signal CE may occur either when signal CLK is at a logic low, or at a logic high.

If, for example, signal CE is asserted to a logic high value (thus enabling DDR latch 600) during a logic high level of signal CLK, then the master stage for data path DR would drive slave stage 610 to set node Q. Conversely, if signal CE is asserted to a logic high value during a logic low level of signal CLK, then the master stage for data path DF would drive slave stage 610 to set node Q. Thus, by establishing the logic value at nodes 620 and 622 to be the same at and during the time that DDR latch 600 is deactivated, node Q is guaranteed to assume the same logic state it had when DDR latch 600 was deactivated.

Thus, while signal CE is effective to disable data paths DR and DF, signal CE is also effective to maintain nodes 620 and 622 at the same logic value as node a during deactivation. In particular, by deasserting signal CE to a logic low value, the output of inverter 616 asserts to a logic high value, which causes transistors 612 and 614 to transition to a conductive state. Thus, the logic value at node Q is substantially applied to nodes 620 and 622 via the conductivity states of transistors 612 and 614, respectively, while DDR latch 600 is disabled. Similarly to DDR latch 400 of FIG. 4, DDR latch 600, depending upon the logic values of signals DR_EN and DF_EN, may operate as a rising edge triggered D flip-flop, or a falling edge triggered D flip-flop, as well.

Figure 7:
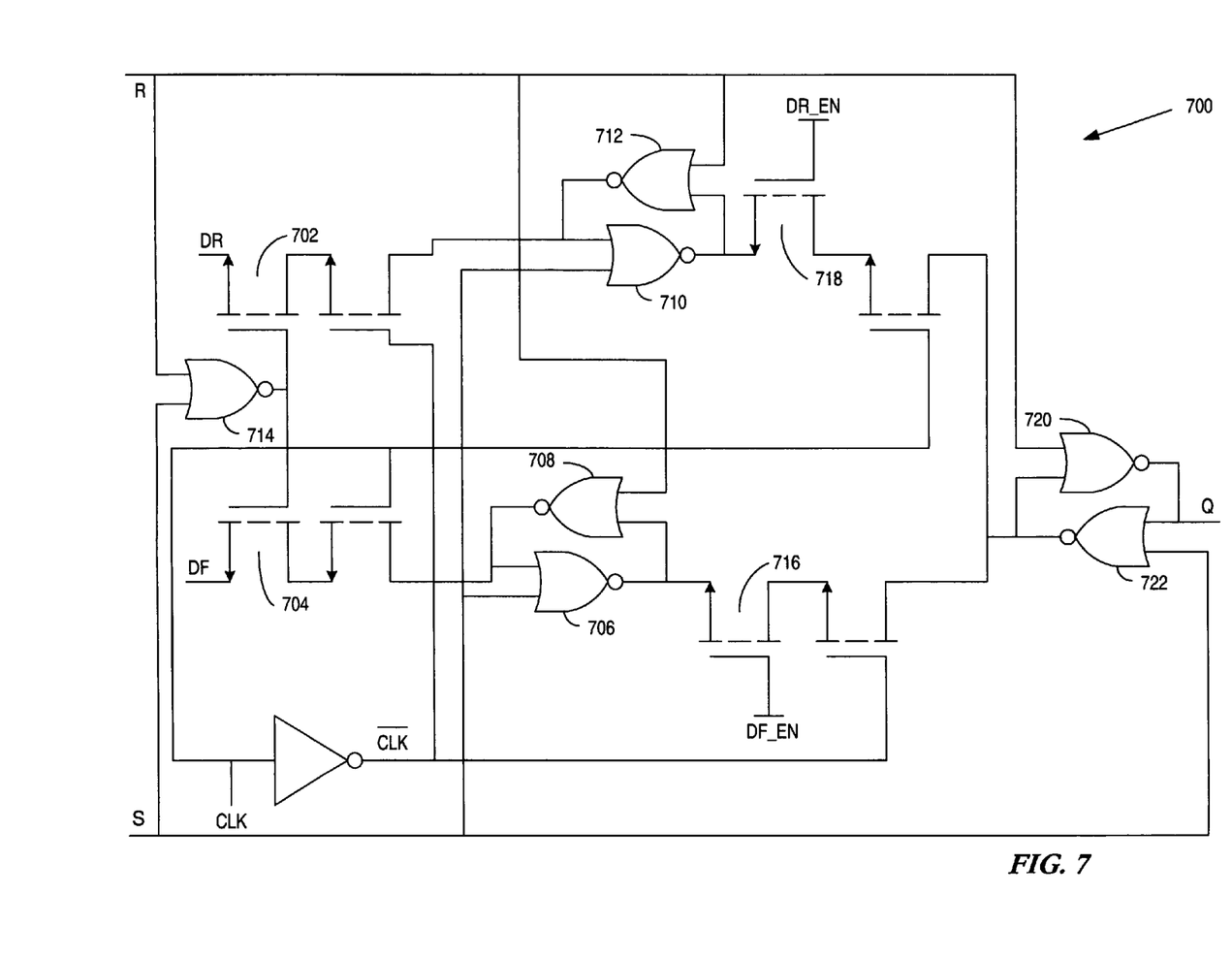
FIG. 7 illustrates an alternative embodiment of a DDR latch in accordance with the present invention.

Turning to FIG. 7, an alternative embodiment of DDR latch 700 is exemplified, in which set/reset capability is provided. The inverter feedback implementation for the master/slave stages is replaced with NOR gate feedback implementations as illustrated. Given that the logic values for signals R and S are both at a logic low value, NOR gates 706-712 and 720-722 operate as inverters. Thus, when signals R and S are at logic low values, the operation of DDR latch 700 is similar to the discussion above relating to DDR 400 of FIG. 4.

If a circuit reset is desired, then signal R is asserted to a logic high value, and signal S is deasserted to a logic low value. As such, the output of NOR gate 714 is a logic low value, which places transistors 702 and 704 into a non-conductive state. The logic high value of signal R renders the output of NOR gates 712 and 708 to a logic low value. Thus, NOR gates 710 and 706, each having both inputs at a logic low value, provide a logic high value at their respective outputs.

Given that transistors 718 and 716 are rendered conductive via signals DR_EN and DF_EN, the logic high values of NOR gates 710 and 706 provide a logic high value to a first input of NOR gate 720 at alternating intervals. That is to say, that when signal CLK is at a logic high value, NOR gate 710 places one input of NOR gate 720 at a logic high value. When signal $\overline{CLK}$ is at a logic high value, on the other hand, NOR gate 706 places one input of NOR gate 720 at a logic high value. Thus, irregardless of the logic state of signal CLK, or $\overline{CLK}$, the output of NOR gate 720 (output node Q) remains at a logic low value.

It should be noted, that since signal R is at a logic high value, the output of NOR gate 720 is forced to a logic low value, which is the desired state during a circuit reset. Thus, signal R is said to override signals DR_EN and DF_EN during an active reset condition.

If, on the other hand, a circuit set is desired, then signal S is asserted to a logic high value, and signal R is deasserted to a logic low value. As such, the output of NOR gate 714 is a logic low value, which places transistors 702 and 704 into a non-conductive state. The logic high value of signal S renders the output of NOR gates 706 and 710 to a logic low value. Thus, NOR gates 712 and 708, each having both inputs at a logic low value, provide a logic high at their respective outputs.

Given that transistors 718 and 716 are rendered conductive via signals DR_EN and DF_EN, the logic low output values of NOR gates 710 and 706 provide a logic low value to a first input of NOR gate 720 at alternating intervals. That is to say, that when signal CLK is at a logic high value, NOR gate 710 places one input of NOR gate 720 at a logic low value. When signal $\overline{CLK}$ is at a logic high value, on the other hand, NOR gate 706 places one input of NOR gate 720 at a logic low value. Thus, irregardless of the logic state of signal CLK, or $\overline{CLK}$, the output of NOR gate 720 (output node Q) remains at a logic high value, since signal R is at a logic low value.

It should be noted, that since signal S is at a logic high value and signal R is at a logic low value, that the output of NOR gate 720 is forced to a logic high value, which is the desired state during a circuit set. Thus, signal S is said to override signals DR_EN and DF_EN during an active set condition.

Figure 8:
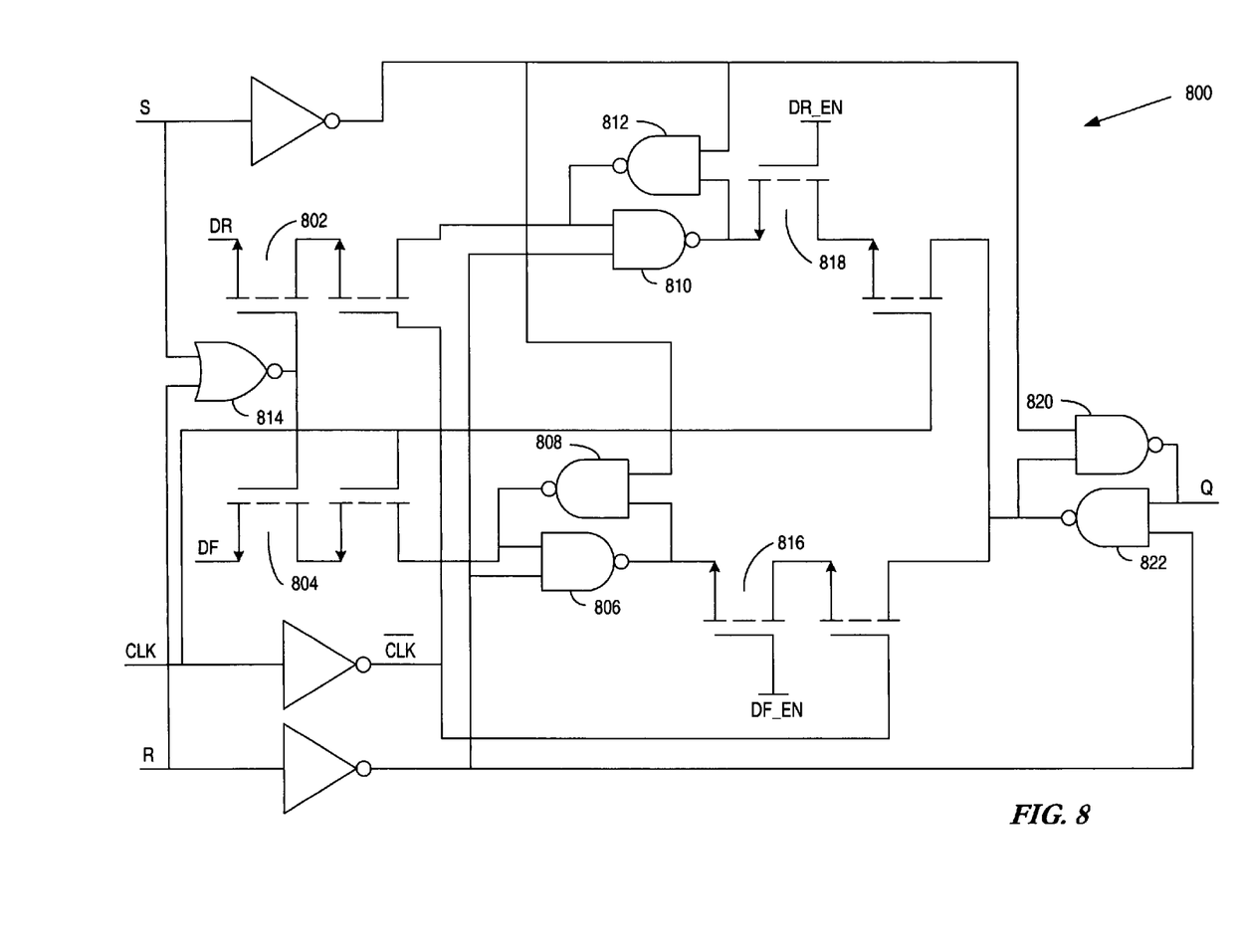
FIG. 8 illustrates an alternative embodiment of a DDR latch in accordance with the present invention.

In an alternative embodiment, DDR latch 800 of FIG. 8 is exemplified, in which the NOR gate latch stages have been replaced with NAND gate latch stages and signals, S and R, are inverted. If a circuit reset is desired, then signal R is asserted to a logic high value, and signal S is deasserted to a logic low value. As such, the output of NOR gate 814 is a logic low value, which places transistors 802 and 804 into a non-conductive state. The logic high value of signal R renders the output of NAND gates 806 and 810 to a logic high value, since signal R is inverted. Thus, NAND gates 808 and 812, each having both inputs at a logic high value (signal S is inverted), provide a logic low value at their respective outputs.

Given that transistors 818 and 816 are rendered conductive via signals DR_EN and DF_EN, the logic high values of NAND gates 810 and 806 provide a logic high value to a first input of NAND gate 820 at alternating intervals. That is to say, that when signal CLK is at a logic high value, NAND gate 810 places one input of NAND gate 820 at a logic high value. When signal $\overline{CLK}$ is at a logic high value, on the other hand, NAND gate 806 places one input of NAND gate 820 at a logic high value. Thus, irregardless of the logic state of signal CLK, or $\overline{CLK}$, the output of NAND gate 820 (output node Q) remains at a logic low value.

It should be noted, that since signal R is at a logic high value and signal S is at a logic low value, the output of NAND gate 820 is forced to a logic low value, which is the desired state during a circuit reset. Thus, signal R is said to override signals DR_EN and DF_EN during an active reset condition.

If, on the other hand, a circuit set is desired, then signal S is asserted to a logic high value, and signal R is deasserted to a logic low value. As such, the output of NOR gate 814 is a logic low value, which places transistors 802 and 804 into a non-conductive state. The logic high value of signal S renders the output of NAND gates 812 and 808 to a logic high value. Thus, NAND gates 810 and 806, each having both inputs at a logic high value, provide a logic low value at their respective outputs.

Given that transistors 818 and 816 are rendered conductive via signals DR_EN and DF_EN, the logic low output values of NAND gates 810 and 806 provide a logic low value to a first input of NAND gate 820 at alternating intervals. That is to say, that when signal CLK is at a logic high value, NAND gate 810 places one input of NAND gate 820 at a logic low value. When signal $\overline{CLK}$ is at a logic high value, on the other hand, NAND gate 806 places one input of NAND gate 820 at a logic low value. Thus, irregardless of the logic state of signal CLK, or $\overline{CLK}$, the output of NAND gate 820 (output node Q) remains at a logic high value, since signal R is at a logic low value.

It should be noted, that since signal S is at a logic high value and signal R is at a logic low value, that the output of NAND gate 820 is forced to a logic high value, which is the desired state during a circuit set. Thus, signal S is said to override signals DR_EN and DF_EN during an active set condition.

FIGS. 7-8, therefore, present alternative embodiments of the present invention exhibiting set and reset capability through the use of NAND and NOR gate latch stages. It should be noted, that those embodiments may further be modified to allow for reset only, or set only, operation.

In particular, if reset only operation is desired, then the embodiment of FIG. 7 may be modified to replace NOR gates 706, 710, 714, and 722 with inverters to remove the need for signal S. Alternatively, NAND gates 808, 812, and 820 along with NOR gate 814 of FIG. 8 may be replaced with inverters to remove the need for signal S. In either instance, reset only operation is provided along with the ability to separately enable the DR and DF data paths.

On the other hand, if set only operation is desired, then the embodiment of FIG. 7 may be modified to replace NOR gates 708, 712, 714, and 720 with inverters to remove the need for signal R. Alternatively, NAND gates 810, 806, and 822 along with NOR gate 814 of FIG. 8 may be replaced with inverters to remove the need for signal R. In either instance, set only operation is provided along with the ability to separately enable the DR and DF data paths.

Application of some embodiments of the present invention may be particularly useful in integrated circuits (ICs), since with many IC applications, such as programmable logic devices (PLDs), the input/output (I/O) portions of the PLDs may be extremely crowded. Since some embodiments of the present invention obviate the need for a 2:1 multiplexer, signal paths to and from the DDR latch are reduced in number. In particular, the number of outputs from the DDR latch is reduced from two to one, while the need for a multiplexer control signal is also removed.

In addition, features such as chip enable, set, and reset that are typically found with DDR latches are also preserved by some embodiments of the present invention. Still further, some embodiments of the present invention provides separate enabling/disabling of the data paths, such that rising edge and falling edge D flip-flop operation is facilitated.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A latch, comprising:
   a first master stage coupled to receive a first data signal and a clock signal and adapted to latch the first data signal at a first node in response to a first phase of the clock signal;
   a second master stage coupled to receive a second data signal and the clock signal and adapted to latch the second data signal at a second node in response to a second phase of the clock signal; and
   a slave stage adaptively coupled to the first and second nodes, the slave stage being coupled to the first node during the first phase of the clock signal and being coupled to the second node in response to the second phase of the clock signal.

2. The latch of claim 1, wherein the first master stage comprises:
   a first pass gate coupled to receive the clock signal and the first data signal and adapted to pass the first data signal in response to the second phase of the clock signal;
   a first logic gate having an input coupled to receive the first data signal from the first pass gate;
   a second logic gate having an input coupled to an output of the first logic gate and an output coupled to the input of the first logic gate; and
   a second pass gate coupled to the output of the first logic gate and coupled to receive the clock signal, the second pass gate being adapted to pass the first data signal in response to the first phase of the clock signal.

3. The latch of claim 2, wherein the first and second pass gates include field effect transistors (FETs).

4. The latch of claim 2, wherein the first and second pass gates include a complementary metal oxide semiconductor (CMOS) transistor pair.

5. The latch of claim 2, wherein the second master stage comprises:
   a third pass gate coupled to receive the clock signal and the second data signal and adapted to pass the second data signal in response to the first phase of the clock signal;
   a third logic gate having an input coupled to receive the second data signal from the third pass gate;
   a fourth logic gate having an input coupled to the output of the third logic gate and an output coupled to the input of the third logic gate; and
   a fourth pass gate coupled to the output of the fourth logic gate and coupled to receive the clock signal, the fourth pass gate being adapted to pass the second data signal in response to the second phase of the clock signal.

6. The latch of claim 5, wherein the third and fourth pass gates include field effect transistors (FETs).

7. The latch of claim 5, wherein the third and fourth pass gates include a complementary metal oxide semiconductor (CMOS) transistor pair.

8. A configurable latch, comprising:
   a first stage adaptively coupled to receive a first data signal and adaptively coupled to provide the first data signal to a common node;
   a second stage adaptively coupled to receive a second data signal and adaptively coupled to provide the second data signal to the common node; and
   a third stage coupled to the common node and adapted to provide the first and second data signals as an output signal of the configurable latch, wherein the first and second stages alternate access to the common node based on a value of a common clock signal driving both the first stage and the second stage.

9. The configurable latch of claim 8, wherein the first stage comprises:
   a latch, the latch including,
      a first logic gate having a first input coupled to receive the first data signal; and
      a second logic gate having a first input coupled to an output of the first logic gate and an output coupled to the first input of the first logic gate; and
   a first pass gate coupled to an input of the latch and adapted to provide the first data signal to the latch in response to a first phase of a clock signal.

10. The configurable latch of claim 9, wherein the first stage further comprises a second pass gate coupled in parallel to the first pass gate and adapted to bypass the first pass gate in response to a latch control signal.

11. The configurable latch of claim 9, wherein the first stage further comprises:
   a third pass gate coupled to the input of the first pass gate and coupled to receive a first data path enable signal and adapted to provide the first data signal to the first pass gate in response to a first logic level of the first data path enable signal;
   a third logic gate coupled to receive the first data path enable signal and adapted to provide a disable signal in response to a second logic level of the first data path enable signal; and
   a transistor coupled to receive the disable signal and adapted to couple the output signal of the configurable latch to the input of the latch in response to the disable signal.

12. The configurable latch of claim 9, wherein the first stage further comprises:
   a third logic gate coupled to receive a reset signal and adapted to provide a first logic value of a first data path enable signal in response to a first logic value of the reset signal and adapted to provide a second logic value of the first data path enable signal in response to a second logic value of the reset signal;
   a third pass gate coupled to the input of the first pass gate and coupled to receive the first data path enable signal and adapted to provide the first data signal to the first pass gate in response to the first logic level of the first data path enable signal; and
   wherein the second logic gate is coupled to receive the reset signal at a second input and is adapted to reset the output signal of the configurable latch to a logic low value in response to the second logic value of the reset signal.

13. The configurable latch of claim 9, wherein the first stage further comprises a fourth pass gate coupled to the output of the latch and adapted to provide the first data signal in response to a second data path enable signal.

14. The configurable latch of claim 13, wherein the first stage further comprises a fifth pass gate coupled to the output of the fourth pass gate and adapted to provide the first data signal to the common node in response to a second phase of the clock signal.

15. The configurable latch of claim 8, wherein the second stage comprises:
   a latch, the latch including,
      a first logic gate having a first input coupled to receive the second data signal; and
      a second logic gate having a first input coupled to an output of the first logic gate and an output coupled to the first input of the first logic gate; and a first pass gate coupled to an input of the latch and adapted to provide the second data signal to the latch in response to a second phase of a clock signal.

16. The configurable latch of claim 15, wherein the second stage further comprises:
  a second pass gate coupled to the input of the first pass gate and coupled to receive a first data path enable signal and adapted to provide the second data signal to the first pass gate in response to a first logic level of the first data path enable signal;
  a third logic gate coupled to receive the first data path enable signal and adapted to provide a disable signal in response to a second logic level of the first data path enable signal; and
  a transistor coupled to receive the disable signal and adapted to couple the output signal of the configurable latch to the input of the latch in response to the disable signal.

17. The configurable latch of claim 15, wherein the second stage further comprises:
  a third logic gate coupled to receive a set signal and adapted to provide a first logic value of a first data path enable signal in response to a first logic value of the set signal and adapted to provide a second logic value of the first data path enable signal in response to a second logic value of the set signal;
  a second pass gate coupled to the input of the first pass gate and coupled to receive the first data path enable signal and adapted to provide the second data signal to the first pass gate in response to the first logic level of the first data path enable signal; and
  wherein the first logic gate is coupled to receive the set signal at a second input and is adapted to set the output signal of the configurable latch to a logic high value in response to the second logic value of the set signal.

18. The configurable latch of claim 17, wherein the second stage further comprises a third pass gate coupled to the output of the latch and adapted to provide the second data signal in response to a second data path enable signal.

19. The configurable latch of claim 18, wherein the second stage further comprises a fourth pass gate coupled to the output of the third pass gate and adapted to provide the second data signal to the common node in response to a first phase of the clock signal.

20. A configurable latch, comprising:
  means for adaptively latching a first data signal at a first node during a first phase of a clock signal;
  means for adaptively latching a second data signal at a second node during a second phase of the clock signal; and
  means for passing the first and second data signals received from the first and second nodes through a single latch to provide an output of the configurable latch.

* * * * *